United States Patent
Jeon et al.

(10) Patent No.: US 9,766,760 B2
(45) Date of Patent: Sep. 19, 2017

(54) LIQUID CRYSTAL DISPLAY DEVICE INCORPORATING CAPACITVE TOUCH KEYS TO MAXIMIZE USER CONVENIENCE

(71) Applicant: Samsung Display Co., Ltd., Yongin, Gyeonggi-Do (KR)

(72) Inventors: Jae-Hwan Jeon, Asan-si (KR); Jeong-Young Kim, Yecheon-gun (KR); Len Kaplan, Hwaseong-si (KR); Sung-Dong Park, Asan-si (KR); Sang-Hwan Lee, Asan-si (KR); Young-Suk Cho, Seoul (KR); Ki-Seok Cha, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 165 days.

(21) Appl. No.: 14/596,794

(22) Filed: Jan. 14, 2015

(65) Prior Publication Data

US 2015/0248181 A1    Sep. 3, 2015

(30) Foreign Application Priority Data

Mar. 3, 2014   (KR) ........................ 10-2014-0025051

(51) Int. Cl.
*G06F 3/044*  (2006.01)
*G02F 1/1333*  (2006.01)
(Continued)

(52) U.S. Cl.
CPC .......... *G06F 3/044* (2013.01); *G02F 1/13338* (2013.01); *G06F 3/02* (2013.01);
(Continued)

(58) Field of Classification Search
CPC .... H03K 17/9622; H03K 2217/960755; G06F 3/02; G02F 2001/13332
See application file for complete search history.

(56) References Cited

U.S. PATENT DOCUMENTS

| | | | |
|---|---|---|---|
| 8,508,687 B2* | 8/2013 | Kim | ................. G02F 1/133308 349/58 |
| 2009/0303198 A1* | 12/2009 | Yilmaz | ............. H03K 17/9622 345/173 |

(Continued)

FOREIGN PATENT DOCUMENTS

KR   10-2015-0052926 A   5/2015

OTHER PUBLICATIONS

Keng, Japanese Patent Application Publication JP2013-228485, 2013, machine translation.*

*Primary Examiner* — Tracie Y Green
(74) *Attorney, Agent, or Firm* — Robert E. Bushnell, Esq.

(57) ABSTRACT

A liquid crystal display device includes a backlight assembly, a liquid crystal display panel, a capacitive type touch function key, a cover film and a receiving container. The backlight assembly is configured to generate light. The liquid crystal display panel is disposed on the backlight assembly. The liquid crystal display panel includes an array substrate and an opposing substrate facing the array substrate. The capacitive type touch function key is disposed adjacent to a side surface of one of the array substrate and the opposing substrate. The cover film overlaps the liquid crystal display panel and the capacitive type touch function key. The receiving container receives the backlight assembly, the liquid crystal display panel and the capacitive type touch function key.

19 Claims, 8 Drawing Sheets

(51) Int. Cl.
*G06F 3/02* (2006.01)
*H03K 17/96* (2006.01)

(52) U.S. Cl.
CPC .............. *H03K 17/9622* (2013.01); *G02F 2001/13332* (2013.01); *H03K 2217/960755* (2013.01)

(56) References Cited

U.S. PATENT DOCUMENTS

| | | | | |
|---|---|---|---|---|
| 2011/0234429 A1* | 9/2011 | Burchill | .............. | G06F 3/04847 341/33 |
| 2014/0146245 A1* | 5/2014 | Ahn | .............. | G06F 3/041 349/12 |
| 2014/0320765 A1* | 10/2014 | Jiang | .............. | G06F 3/041 349/12 |
| 2015/0022495 A1* | 1/2015 | Bussat | .............. | G06F 3/044 345/174 |

* cited by examiner

LIQUID CRYSTAL DISPLAY DEVICE INCORPORATING CAPACITVE TOUCH KEYS TO MAXIMIZE USER CONVENIENCE

CLAIM OF PRIORITY

This application makes reference to, incorporates the same herein, and claims all benefits accruing under 35 U.S.C. §119 from an application earlier filed in the Korean Intellectual Property Office on 3 Mar. 2014 and there duly assigned Serial No. 10-2014-0025051.

BACKGROUND OF THE INVENTION

Field of the Invention

Exemplary embodiments of the inventive concept relate to a liquid crystal display device. More particularly, exemplary embodiments of the inventive concept relate to a liquid crystal display device capable of improving convenience of a user.

Description of the Related Art

A liquid crystal display device may include a backlight unit generating light and a liquid crystal display panel controlling the light. The liquid crystal display panel may include an array substrate, an opposing substrate and a liquid crystal layer therebetween. The array substrate may include a plurality of pixel electrodes. The liquid crystal display device may further include an image driving part to apply a voltage to the pixel electrodes. The image driving part may drive the liquid crystal display panel to display an image thereon. An electric field formed by the voltage may adjust an alignment of liquid crystal molecules in the liquid crystal layer.

The liquid crystal display device may further include a receiving container. The receiving container may receive the backlight unit and the liquid crystal display panel. The receiving container may include a mold frame and a chassis. The mold frame may receive the backlight unit. The chassis may fix the liquid crystal display panel. A portion of the chassis may be exposed externally.

Research and development have been conducted to display a high-definition large image or to improve convenience of a user. For example, the liquid crystal display device may implement a large screen of which a bezel is rarely recognized by a viewer.

The above information disclosed in this Background section is only for enhancement of understanding of the background of the invention and therefore it may contain information that does not form the prior art that is already known in this country to a person of ordinary skill in the art.

SUMMARY OF THE INVENTION

Embodiments of the instant inventive concept provide a liquid crystal display device capable of improving viewing convenience of a user.

In an exemplary embodiment of a liquid crystal display device according to the inventive concept, the liquid crystal display device includes a backlight assembly, a liquid crystal display panel, a capacitive type touch function key, a cover film and a receiving container. The backlight assembly is configured to generate light. The liquid crystal display panel is disposed on the backlight assembly. The liquid crystal display panel includes an array substrate and an opposing substrate facing the array substrate. The capacitive type touch function key is adjacent to a side surface of one of the array substrate and the opposing substrate. The cover film overlaps the liquid crystal display panel and the capacitive type touch function key. The receiving container receives the backlight assembly, the liquid crystal display panel and the capacitive type touch function key.

In an exemplary embodiment, a width of the array substrate may be greater than a width of the opposing substrate along a first direction.

In an exemplary embodiment, the capacitive type touch function key may be configured to adjust one of brightness, chrominance and contrast of an image displayed on the liquid crystal display panel.

In an exemplary embodiment, the cover film may include a flat surface.

In an exemplary embodiment, the cover film may include a light transmitting area and a printing area adjacent to the light transmitting area.

In an exemplary embodiment, the printing area may overlap the capacitive type touch function key.

In an exemplary embodiment, a width of the printing area may be greater than a width of the capacitive type touch function key.

In an exemplary embodiment, the printing area may include a first printing area having a first color and a second printing area having a second color different from the first color.

In an exemplary embodiment, the capacitive type touch function key may overlap the first printing area.

In an exemplary embodiment, the liquid crystal display device may further include a first polarizing film disposed on the array substrate and a second polarizing film disposed on the opposing substrate.

In an exemplary embodiment, the liquid crystal display device may further include an adhesive member to attach the first polarizing film with the cover film.

In an exemplary embodiment, a thickness of the capacitive type touch function key may be equal to or less than a sum of a thickness of the opposing substrate and a thickness of the second polarizing film.

In an exemplary embodiment, the liquid crystal display device may further include a spacer overlapping a portion of the array substrate. The capacitive type touch function key may be attached to the spacer.

In an exemplary embodiment, a thickness of the spacer may be substantially equal to a sum of a thickness of the opposing substrate and a thickness of the second polarizing film.

In an exemplary embodiment, the array substrate may be disposed between the backlight assembly and the opposing substrate.

In an exemplary embodiment, the capacitive type touch function key may be disposed on the array substrate.

In an exemplary embodiment, the opposing substrate may be disposed between the backlight assembly and the array substrate.

In an exemplary embodiment, the receiving container may include a mold frame and a bottom chassis. The mold frame may receive the backlight assembly and partially support a rear surface of the liquid crystal display panel. The bottom chassis may receive the liquid crystal display panel, the capacitive type touch function key and the mold frame.

In an exemplary embodiment, the cover film may include a flat surface portion and a curved surface portion. The flat surface portion may overlap the liquid crystal display panel and the capacitive type touch function key. The curved surface portion may be connected to the flat surface portion and surround a portion of the bottom chassis.

According to one or more exemplary embodiment of the liquid crystal display device, the liquid crystal display device may include a capacitive type touch function key to adjust brightness, chrominance, contrast, or the like of the liquid crystal display panel, and a cover film may cover both the capacitive type touch function key and the liquid crystal display panel, thereby implementing a flat display screen even in a bezel area without an additional top chassis and improving viewing convenience of a user.

Also, the cover film may include a printing area to display a position of the capacitive type touch function key, thereby easily operating the function key to adjust a display status of the liquid crystal display panel.

Furthermore, the printing area of the color film may include a color printing area, or the cover film may include a curved portion to surround a portion of a bottom chassis, thereby improving an applicability of a design of the liquid crystal display device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, exemplary embodiments of the inventive concept will be described in further detail with reference to the accompanying drawings.

Figure 1:
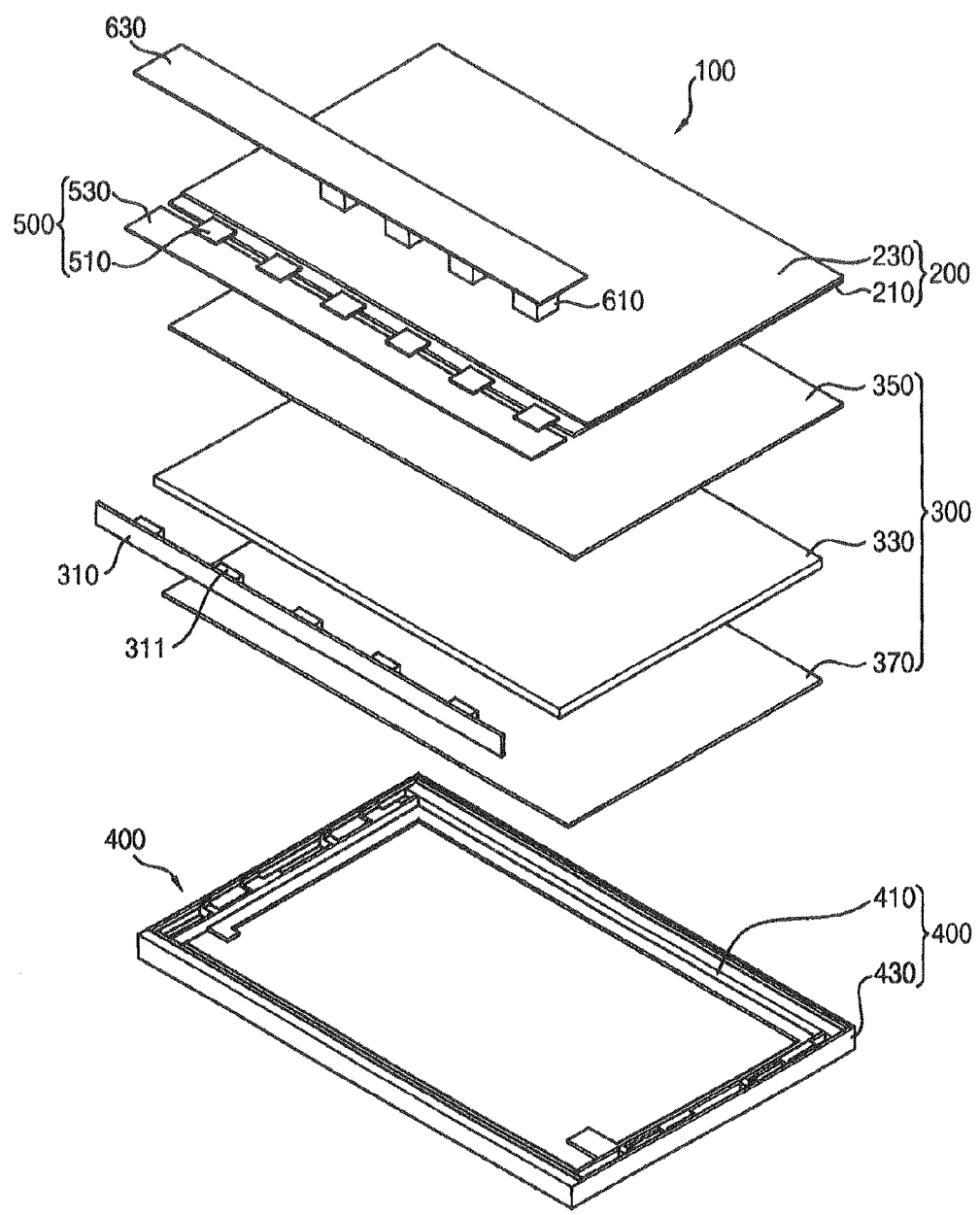
FIG. 1 is an exploded perspective view illustrating a liquid crystal display device according to an exemplary embodiment of the inventive concept.

FIG. 1 is an exploded perspective view illustrating a liquid crystal display device according to an exemplary embodiment of the inventive concept.

In reference to FIG. 1, a liquid crystal display device 100 according to the present exemplary embodiment may include a liquid crystal display panel 200, a backlight assembly 300, a receiving container 400 and a capacitive type touch function key 610. The liquid crystal display device 100 may further include an image driving part 500 and a spacer 630.

The liquid crystal display panel 200 may include an array substrate 210 and an opposing substrate 230. The opposing substrate 230 may face the array substrate 210. Although not illustrated in FIG. 1, a liquid crystal layer may be disposed between the array substrate 210 and the opposing substrate 230.

The array substrate 210 may include a plurality of gate lines, a plurality of data lines, a plurality of switching elements and a plurality of pixel electrodes. The data lines may extend in a first direction. The data lines may be arranged in a second direction crossing the first direction. The gate lines may extend in the second direction. The gate lines may be arranged in the first direction. The switching elements may be electrically connected to the gate lines and the data lines. The pixel electrodes may be electrically connected to the switching elements. According to exemplary embodiments, the array substrate 210 may further include a common electrode, a color filter, a light blocking pattern, or the like. For example, the array substrate 210 may include a plane-to-line switching ("PLS") structure. A plurality of slits may be defined in the pixel electrodes and a horizontal electric field may be formed with the common electrode in the PLS structure. For example, the array substrate 210 may include a black matrix on array substrate ("BOA") structure which includes the light blocking pattern thereon. For example, the array substrate 210 may include a color filter on array substrate ("COA") structure which includes the color filter thereon.

The opposing substrate 230 may face the array substrate 210. The liquid crystal layer may be disposed between the array substrate 210 and the opposing substrate 230. According to exemplary embodiments, the opposing substrate 210 may include a common electrode, a color filter, a light blocking pattern, or the like.

Figure 2:
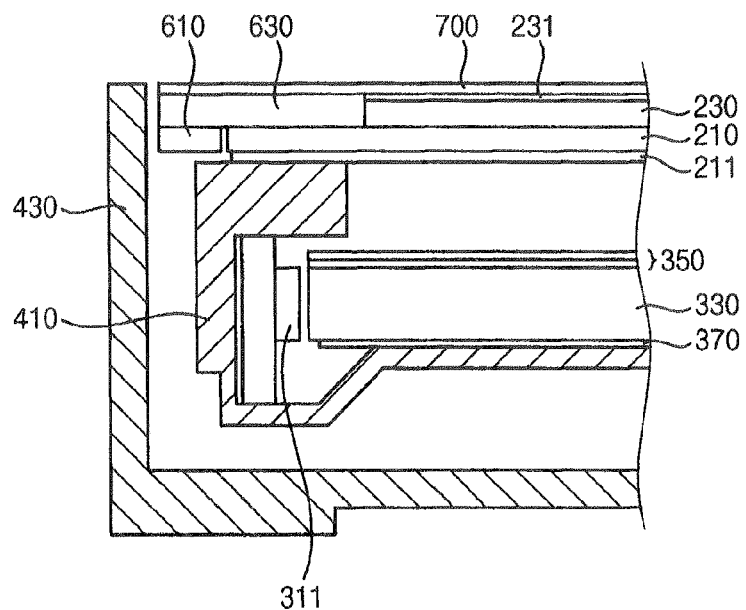
FIG. 2 is a cross-sectional view illustrating an assembled liquid crystal display device in FIG. 1.

The array substrate 210 may have a width greater than the opposing substrate 230 in a plan view. For example, a width of the array substrate 210 may be greater than a width of the opposing substrate 230 along the first direction (for example, as shown in FIG. 2).

The image driving part 500 may be configured to apply electrical signals to the liquid crystal display panel 200. The image driving part 500 may include a gate driving part and the data driving part 510. The gate driving part may be configured to apply gate on/off signals to the gate lines. For example, the gate driving part may be integrated on the array substrate 210. Alternatively, the gate driving part may be disposed on the liquid crystal display panel 200 as a tape carrier package form. The data driving part 510 may be configured to apply image signals to the data lines. For example, the data driving part 510 may be disposed on the liquid crystal display panel as a tape carrier package form. The data driving part 510 may be electrically connected to a circuit board 530.

The backlight assembly 300 may include a light source part 310, a light guiding plate 330, an optical sheet 350 and a reflection sheet 370.

The light source part 310 may include a plurality of point light sources 311. The point light sources 311 may be arranged spaced apart from each other by a gap. For example, the point light sources 311 may include a light emitting diode.

The light guiding plate 330 may overlap a display area of the liquid crystal display panel 200. The light guiding plate 330 may be configured to guide light incident from the light source part 310 toward a direction perpendicular to the incident light. For example, the light from the point light sources 311 may enter a side surface of the light guiding plate 330 and may emit through an upper surface of the light guiding plate 330. The light guiding plate 330 may include a transparent material. For example, the light guiding plate 330 may include a poly methyl methacrylate ("PMMA"), or the like.

The reflection sheet 370 may be disposed on a rear surface of the light guiding plate 330. The reflection sheet 370 may be configured to reflect the light from the point light sources 311 toward the light guiding plate 330.

The optical sheet 350 may be disposed on the upper surface of the light guiding plate 330. The optical sheet 350 may be configured to diffuse the light from the light guiding plate 330.

Although the backlight assembly 300 has an edge-illumination type structure in FIG. 1, the backlight assembly of the liquid crystal display device according to exemplary embodiments of the inventive concept is not limited thereto. For example, the backlight assembly 300 may have a direct-illumination type structure in which a light source is disposed under the display area of the liquid crystal display panel 200.

The receiving container 400 may include a mold frame 410 and a bottom chassis 430.

The mold frame 410 may receive the backlight assembly 300. The mold frame 410 may support the liquid crystal display panel 200. For example, the mold frame 410 may partially support a rear surface of the liquid crystal display panel 200.

The bottom chassis 430 may receive the mold frame 410, the liquid crystal display panel 200 and the capacitive type touch function key 610. The bottom chassis 430 may include side surfaces and a bottom portion connected to the side surfaces.

The capacitive type touch function key 610 may be disposed adjacent to a side surface of one of the array substrate 210 and the opposing substrate 230. For example, the capacitive type touch function key 610 may be disposed adjacent to a side surface of the array substrate 210. In the present exemplary embodiment, the capacitive type touch function key 610 may be attached to a spacer 630. The spacer 630 may have a thickness substantially equal to or greater than the opposing substrate 230. The spacer 630 may overlap an end portion of the array substrate 210. The spacer 630 may have a plate shape extending in a direction. For example, a width of the array substrate 210 along the direction in which the spacer 630 extends may be substantially equal to a width of the spacer 630. For example, the spacer 630 may include a tempered glass, or the like.

The capacitive type touch function key 610 may be disposed between the side surface of the array substrate 210 and the bottom chassis 430. The capacitive type touch function key 610 may include a function key configured to adjust brightness, chrominance, contrast of an image displayed on the liquid crystal display panel 200. The capacitive type touch function key may be operable as a capacitive type. The capacitive type touch function key 610 may be further described in detail referring to FIG. 4.

FIG. 2 is a cross-sectional view illustrating the liquid crystal display device in FIG. 1.

In reference to FIG. 1 and FIG. 2, the liquid crystal display device 100 according to the present exemplary embodiment may further include a cover film 700. The liquid crystal display panel 200 may include a first polarizing film 211 disposed on the array substrate 210 and a second polarizing film 231 disposed on the opposing substrate 230.

The first polarizing film 211 and the second polarizing film 231 may be configured to polarize light from the backlight assembly 300 toward an angle. For example, a first polarizing angle of the first polarizing film 211 may be substantially parallel with or perpendicular to a second polarizing angle of the second polarizing film 231.

The cover film 700 may be disposed on the opposing substrate 230 on which the second polarizing film 231 is disposed. The cover film 700 may overlap the liquid crystal display panel 200 and the capacitive type touch function key 610.

In the present exemplary embodiment, a thickness of the spacer 630 may be substantially equal to a sum of thicknesses of the opposing substrate 230 and the second polarizing film 231. Accordingly, the cover film 700 may include a substantially a flat surface on the spacer 630 and the second polarizing film 231. The cover film 700 may be further described in detail referring to FIG. 5A and FIG. 5B.

Figure 3:
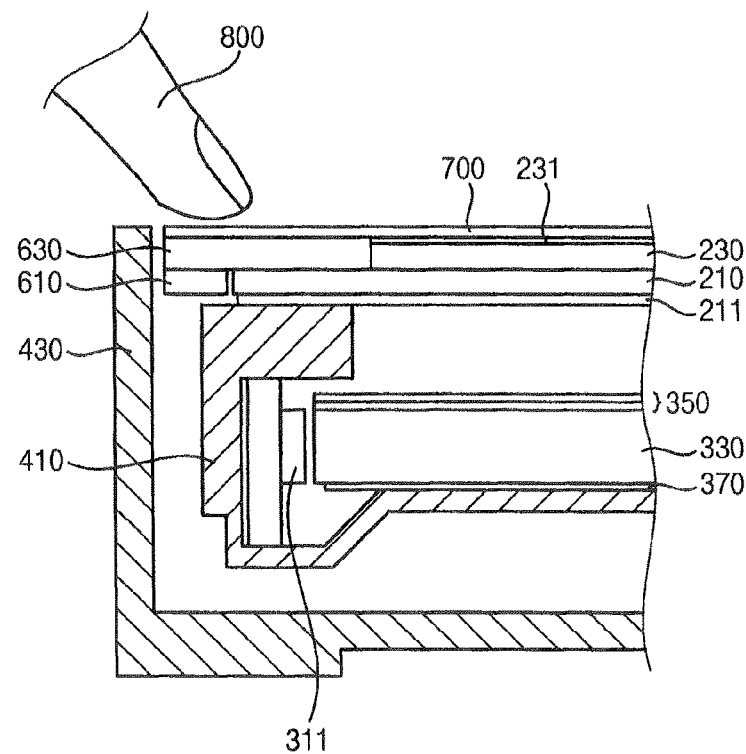
FIG. 3 is a cross-sectional view illustrating an operation of a capacitive type touch function key of the liquid crystal display device in FIG. 2.

FIG. 3 is a cross-sectional view illustrating an operation of a capacitive type touch function key of the liquid crystal display device in FIG. 2.

In reference to FIG. 1, FIG. 2 and FIG. 3, if a portion of a user's body 800 is adjacent to the cover film 700 on the capacitive type touch function key 610, the capacitive type touch function key 610 may be operated. For example, if the capacitive type touch function key 610 is configured to adjust brightness, chrominance, contrast, or the like of an image displayed on the liquid crystal display panel 200, then features of the image having the brightness, chrominance, contrast, or the like may be altered by a predetermined level.

Figure 4:
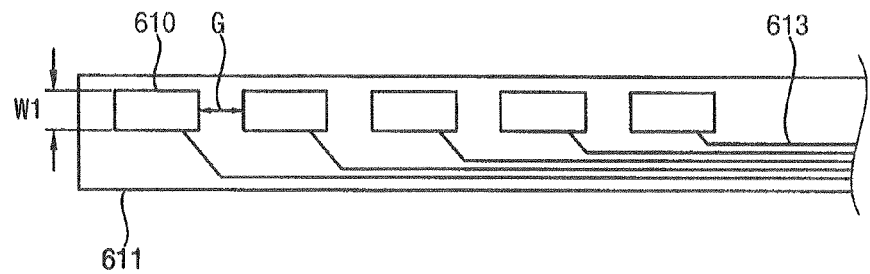
FIG. 4 is a plan view illustrating a capacitive type touch function key of the liquid crystal display device in FIG. 2.

FIG. 4 is a plan view illustrating a capacitive type touch function key of the liquid crystal display device in FIG. 2.

In reference to FIG. 4, the capacitive type touch function key 610 according to the present exemplary embodiment may be disposed on a film 611. For example, a plurality of capacitive type touch function keys 610 may be disposed on the film 611. For example, the plurality of capacitive type touch function keys 610 may be spaced apart from each other by a gap G. The capacitive type touch function key 610 may have a first width W1. The capacitive type touch function key 610 may be electrically connected to a signal line 613.

Figure 5A:
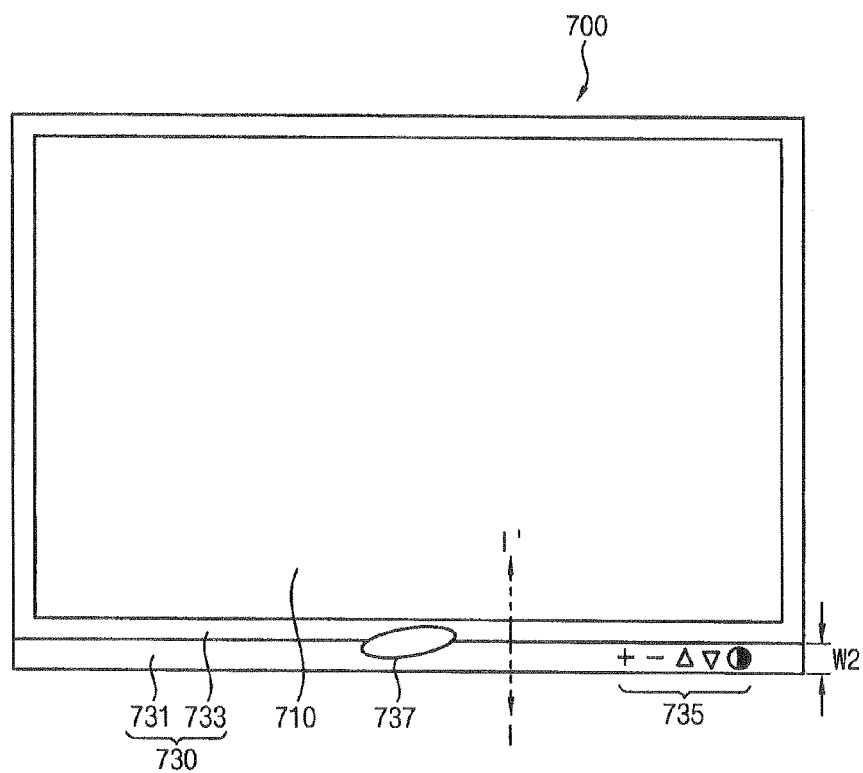
FIG. 5A is a plan view illustrating a cover film of the liquid crystal display device in FIG. 2.
Figure 5B:
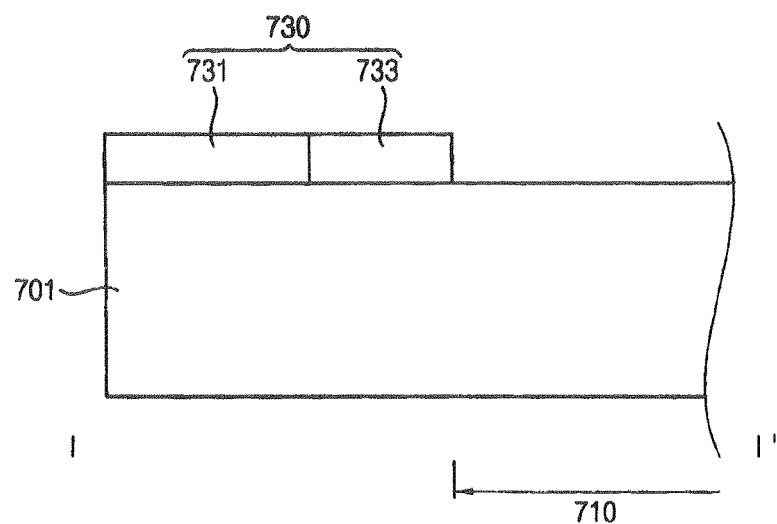
FIG. 5B is a cross-sectional view cut along a line of I-I' in FIG. 5A.

FIG. 5A is a plan view illustrating a cover film of the liquid crystal display device in FIG. 2. FIG. 5B is a cross-sectional view cut along a line of I-I' in FIG. 5A.

In reference to FIG. 5A and FIG. 5B, the cover film 700 may include a transparent film 701 and a printing member on the transparent film 701.

The transparent film 701 may include, e.g., polyethylene terephthalate, anti-shatter film, or the like.

The printing member may have a color. The printing member may include, e.g., ink, or the like. For example, the printing member may include a first printing member having a first color and a second printing member having a second color which is different from the first color.

The cover film 700 may include a printing area 730 and a light transmitting area 710. The printing member may be disposed in the printing area 730. The light transmitting area 710 may be adjacent to the printing area 730.

Light from the liquid crystal display panel 200 may transmit through the light transmitting area 710.

The printing area 730 may, for example, surround the light transmitting area 710. The printing area 730 may include a first printing area 731 on which the first printing member is disposed and a second printing area 733 on which the second printing member is disposed. For example, the first printing area 731 may have a second width W2. The first printing area 731 may be disposed at an end portion of the transparent film 701. The second printing area 733 may be adjacent to the first printing area 731. The second printing area 733 may surround end portions of the transparent film 701.

The first printing area 731 may include a plurality of symbols 735. The symbols 735 may indicate positions and functions of the capacitive type touch function key 610 for a user. For example, the symbols 735 may include a plus (+) sign, a minus (−) sign, a triangle, an inverted triangle, a circle, or the like. In the present exemplary embodiment, the second width W2 of the first printing area 731 may be substantially equal to or greater than the first width W1 of the capacitive type touch function key 610.

The first printing area 731 and the second printing area 733 may include a product logo 737. The product logo 737 may indicate a manufacturer or a vendor of the liquid crystal display device. For example, the product logo 737 may be disposed at a lower middle portion of the cover film 700.

Figure 6:
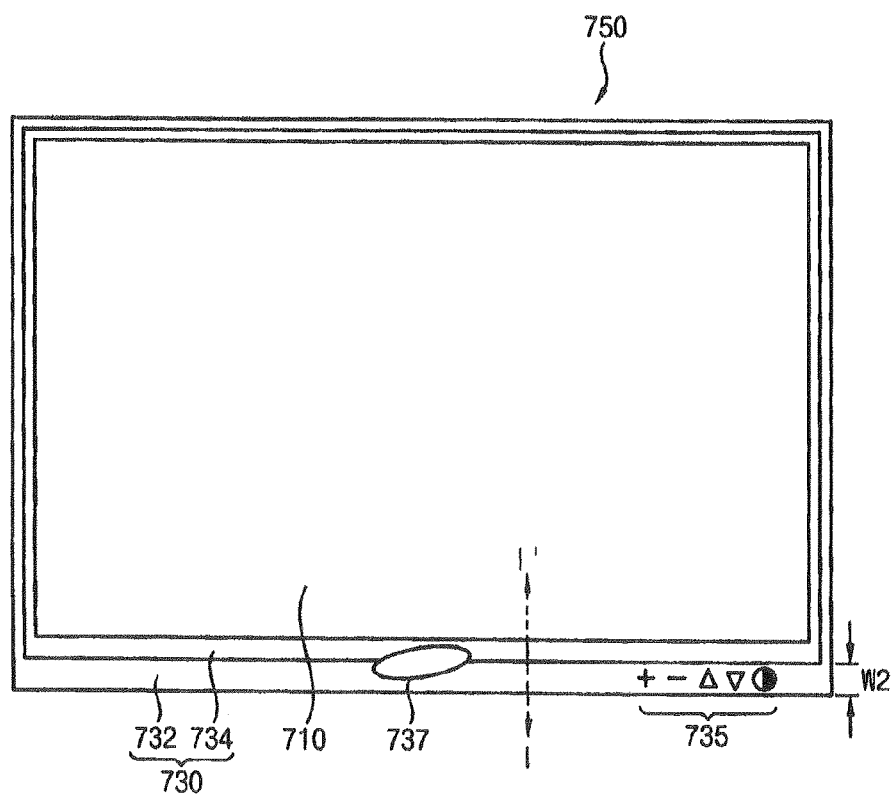
FIG. 6 is a plan view illustrating a cover film of a liquid crystal display device according to an exemplary embodiment of the inventive concept.

FIG. 6 is a plan view illustrating a cover film of a liquid crystal display device according to an exemplary embodiment of the inventive concept.

In reference to FIG. 6, the cover film 750 of the liquid crystal display device according to the present exemplary embodiment may be substantially the same as the cover film 700 illustrated in FIG. 5A except a first printing area 732 and a second printing area 734. Hereinafter, detailed description on the identical elements is omitted.

In the present exemplary embodiment, the first printing area 732 may be disposed at end portions of the cover film 701. For example, the first printing area 732 may surround the cover film 701 in a plan view.

The second printing area 734 may surround the cover film 701 within the first printing area 732 in a plan view.

Figure 7A:
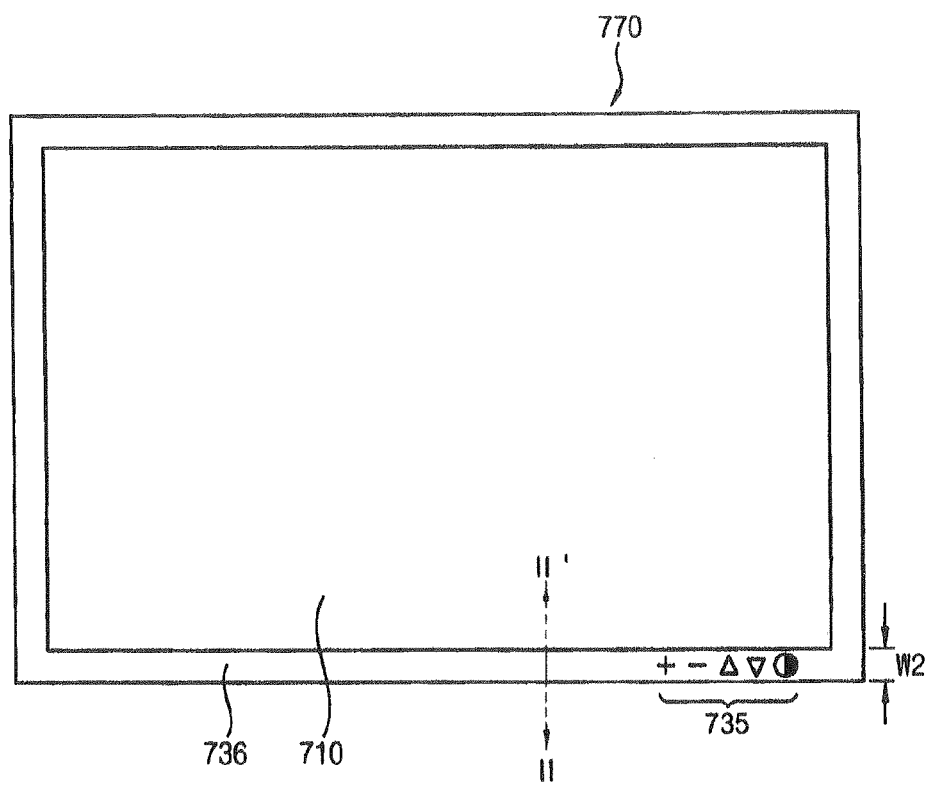
FIG. 7A is a plan view illustrating a cover film of a liquid crystal display device according to an exemplary embodiment of the inventive concept.
Figure 7B:
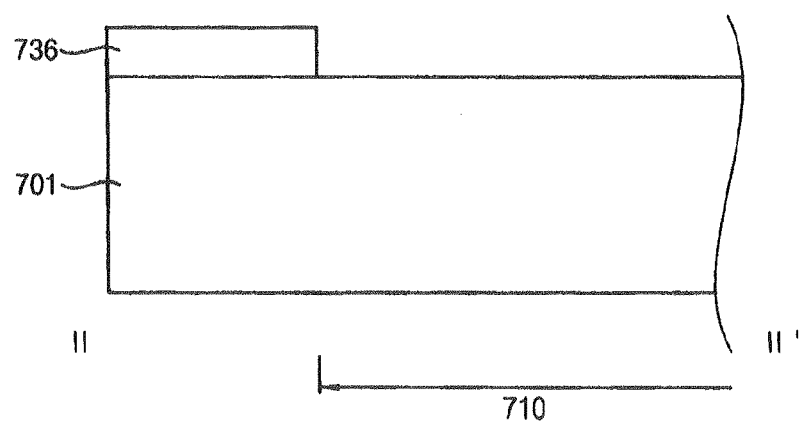
FIG. 7B is a cross-sectional view cut along a line of II-II' in FIG. 7A.

FIG. 7A is a plan view illustrating a cover film of a liquid crystal display device according to an exemplary embodiment of the inventive concept. FIG. 7B is a cross-sectional view cut along a line of II-II' in FIG. 7A.

In reference to FIGS. 7A and 7B, the cover film 770 of the liquid crystal display device according to the present exemplary embodiment is substantially the same as the cover film 700 illustrated in FIG. 5A except a printing area 736. Hereinafter, detailed description on the identical elements is omitted.

The printing area 736 may surround end portions of the cover film 701 in a plan view. The printing area 736 may have a single color or a plurality of colors. For example, the printing area 736 may have a plurality of colors which are displayed as a gradation type. For example, the printing area 736 may include one or more colors such as white, silver, red, green, blue, gold, or the like. The colors may be used alone or in a mixture. A printing area of the cover film of the liquid crystal display device according to exemplary embodiments is not limited thereto, and the printing area may be variously disposed on the cover film according to exemplary embodiments.

Figure 8:
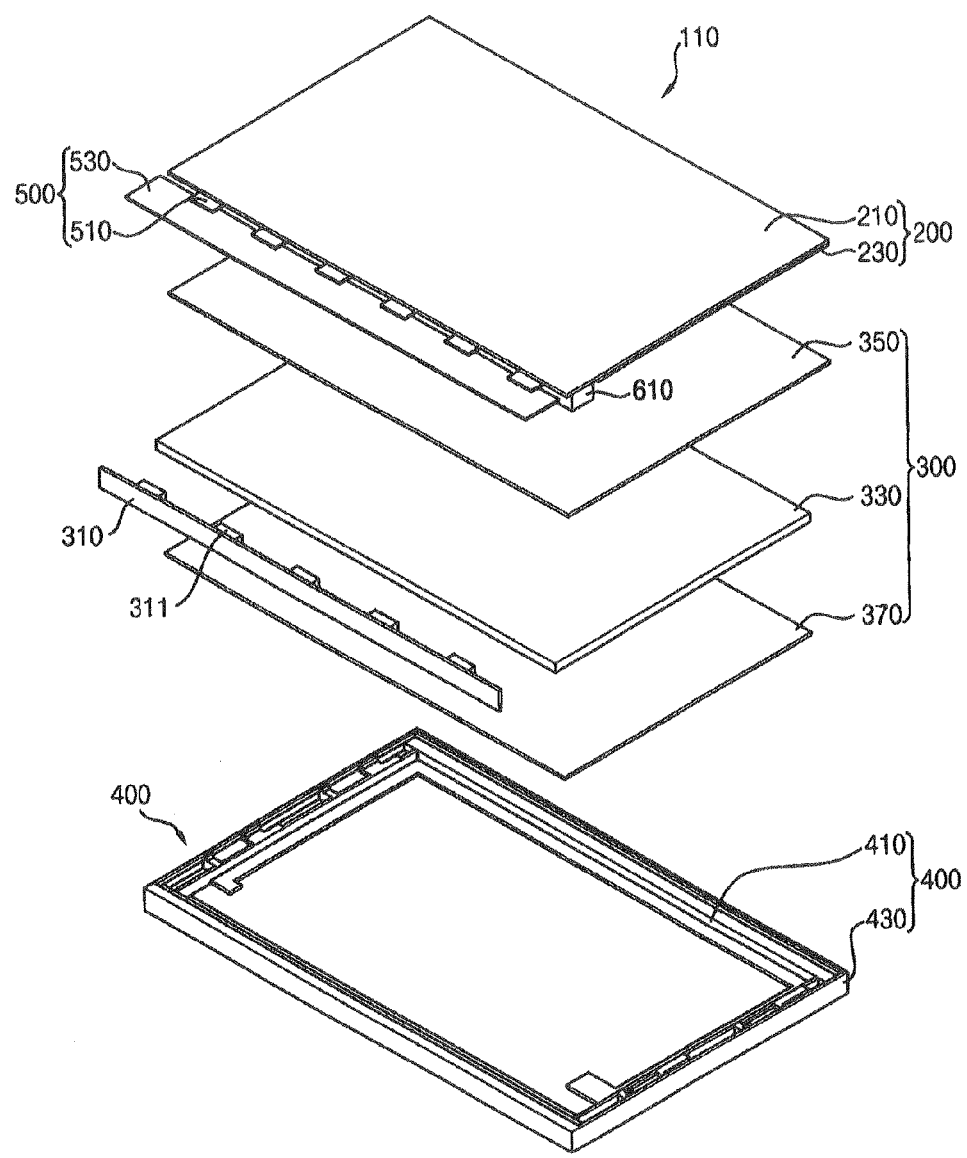
FIG. 8 is an exploded perspective view illustrating a liquid crystal display device according to an exemplary embodiment of the inventive concept.
Figure 9:
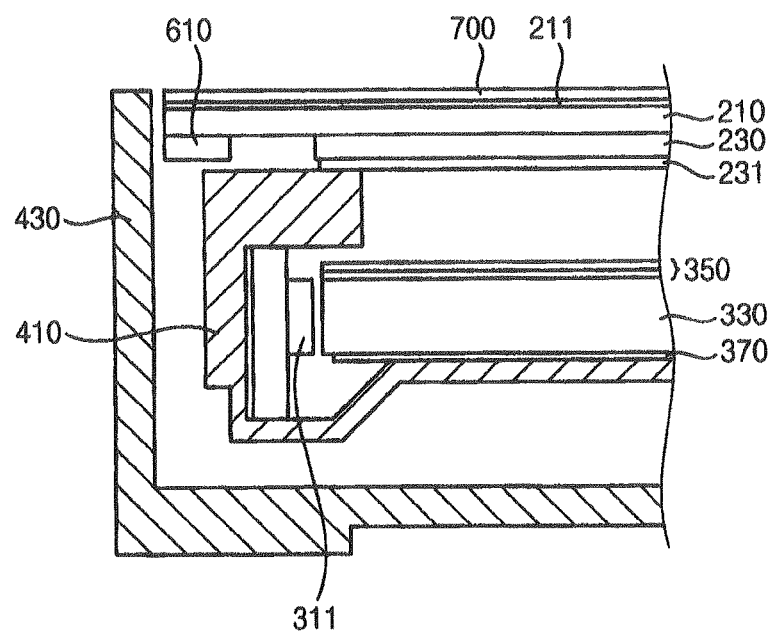
FIG. 9 is a cross-sectional view illustrating an assembled liquid crystal display device in FIG. 8.

FIG. 8 is an exploded perspective view illustrating a liquid crystal display device according to an exemplary embodiment of the inventive concept. FIG. 9 is a cross-sectional view illustrating the liquid crystal display device in FIG. 8.

In reference to FIG. 8 and FIG. 9, a liquid crystal display device 110 according to the present exemplary embodiment may be substantially the same as the liquid crystal display device 100 illustrated in FIG. 1 except a spacer and a capacitive type touch function key 610. Hereinafter, the identical elements are briefly described.

The liquid crystal display device 110 according to the present exemplary embodiment may include a liquid crystal display panel 200, a backlight assembly 300, a receiving container 400, a capacitive type touch function key 610 and a cover film 700. The liquid crystal display device 110 may further include an image driving part 500.

The liquid crystal display panel 200 may include an array substrate 210 and an opposing substrate 230. The opposing substrate 230 may face the array substrate 210. The liquid crystal display panel 200 may further include a first polarizing film 211 disposed on the array substrate 210 and a second polarizing film 231 disposed on the opposing substrate 230. Although not illustrated in FIG. 8 and FIG. 9, a liquid crystal layer may be disposed between the array substrate 210 and the opposing substrate 230.

The array substrate 210 may include a plurality of gate lines, a plurality of data lines, a plurality of switching elements and a plurality of pixel electrodes. The data lines may extend in a first direction. The data lines may be arranged in a second direction crossing the first direction. The gate lines may extend in the second direction. The gate lines may be arranged in the first direction. The switching elements may be electrically connected to the gate lines and the data lines. The pixel electrodes may be electrically connected to the switching elements.

The opposing substrate 230 may face the array substrate 210. The liquid crystal layer may be disposed between the array substrate 210 and the opposing substrate 230.

The array substrate 210 may have a width greater than the opposing substrate 230 in a plan view. For example, a width of the array substrate 210 may be greater than a width of the opposing substrate 230 along the first direction.

The image driving part 500 may be configured to apply electrical signals to the liquid crystal display panel 200. The image driving part 500 may include a gate driving part and the data driving part 510. The data driving part 510 may be electrically connected to a circuit board 530.

The backlight assembly 300 may include a light source part 310, a light guiding plate 330, an optical sheet 350 and a reflection sheet 370.

The light source part 310 may include a plurality of point light sources 311. The point light sources 311 may be arranged by a gap.

The light guiding plate 330 may overlap a display area of the liquid crystal display panel 200. The light guiding plate 330 may be configured to guide light incident from the light source part 310 toward a direction perpendicular to the incident light.

The reflection sheet 370 may be disposed on a rear surface of the light guiding plate 330. The reflection sheet 370 may be configured to reflect the light from the point light sources 311 toward the light guiding plate 330.

The optical sheet 350 may be disposed on the upper surface of the light guiding plate 330. The optical sheet 350 may be configured to diffuse the light from the light guiding plate 330.

Although the backlight assembly 300 has an edge-illumination type structure in FIG. 8, the backlight assembly of the liquid crystal display device according to exemplary embodiments of the inventive concept is not limited thereto. For example, the backlight assembly 300 may have a direct-illumination type structure in which a light source is disposed under a display area of the liquid crystal display panel 200.

The receiving container 400 may include a mold frame 410 and a bottom chassis 430.

The mold frame 410 may receive the backlight assembly 300. The mold frame 410 may support the liquid crystal display panel 200. For example, the mold frame 410 may partially support a rear surface of the liquid crystal display panel 200.

The bottom chassis 430 may receive the mold frame 410, the liquid crystal display panel 200 and the capacitive type touch function key 610. The bottom chassis 430 may include side surfaces and a bottom portion connected to the side surfaces.

The capacitive type touch function key 610 may be disposed adjacent to a side surface of one of the array substrate 210 and the opposing substrate 230. For example, the capacitive type touch function key 610 may be disposed adjacent to a side surface of the opposing substrate 230. The capacitive type touch function key 610 may be disposed on the array substrate 210. For example, the capacitive type touch function key 610 may be disposed on a portion of the array substrate 210 which does not overlap the opposing substrate 230.

In the present exemplary embodiment, the capacitive type touch function key 610 may have a thickness substantially equal to or less than a thickness of the opposing substrate 230. For example, the thickness of the capacitive type touch function key 610 may be substantially equal to a sum of thicknesses of the opposing substrate 230 and the second polarizing film 231.

The capacitive type touch function key 610 may be disposed on the array substrate 210. The capacitive type touch function key 610 may include a function key configured to adjust brightness, chrominance, contrast of an image displayed on the liquid crystal display panel 200. The capacitive type touch function key may be operable as a capacitive type.

The cover film 700 may be disposed on the array substrate 210 on which the first polarizing film 211 is disposed. The cover film 700 may overlap the liquid crystal display panel 200 and the capacitive type touch function key 610. The cover film 700 may include a substantially flat surface on the first polarizing film 211.

Figure 10:
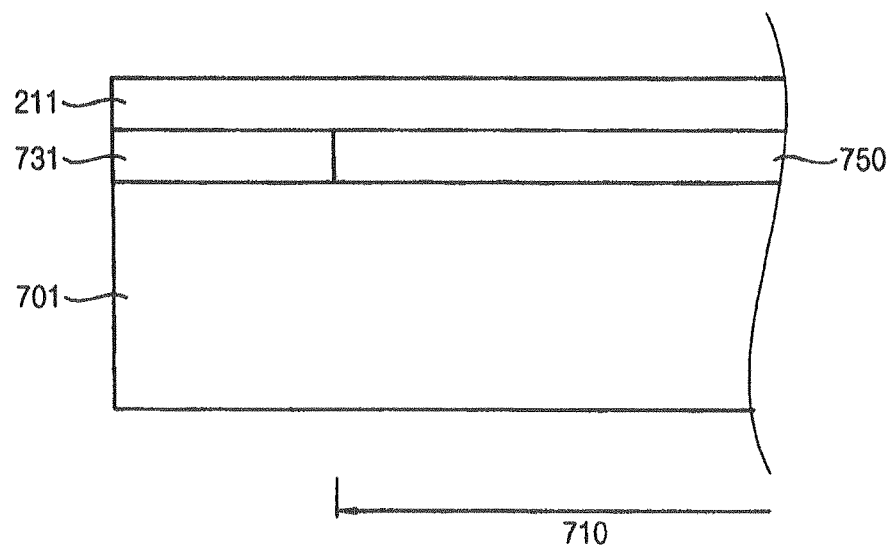
FIG. 10 is a cross-sectional view illustrating a cover film of the liquid crystal display device in FIG. 8.

FIG. 10 is a cross-sectional view illustrating a cover film of the liquid crystal display device in FIG. 8.

In reference to FIG. 8, FIG. 9 and FIG. 10, the cover film 700 may include a transparent film 701, a printing member and an adhesive member 750.

The transparent film 701 may include, for example, polyethylene terephthalate ("PET"), anti-shatter film ("ASF"), or the like.

The printing member may be disposed on the transparent film 701. The printing member may have a color. The printing member may include, for example, ink, or the like. For example, the printing member may include a single color, a plurality of colors, or a mixture thereof.

The cover film 700 may include a printing area 731 and a light transmitting area 710. The printing member may be disposed in the printing area 731. The light transmitting area 710 may be adjacent to the printing area 731.

A light from the liquid crystal display panel 200 may transmit through the light transmitting area 710.

The printing area 731 may be adjacent to the light transmitting area 710. For example, the printing area 731 may surround the light transmitting area 710.

The printing area 731 may include a plurality of symbols. The symbols may indicate positions and functions of the capacitive type touch function key 610 for a user. For example, the symbols may include a plus (+) sign, a minus (−) sign, a triangle, an inverted triangle, a circle, or the like. In the present exemplary embodiment, a width of the printing area 731 may be substantially equal to or greater than a width of the capacitive type touch function key 610.

The adhesive member 750 may be disposed on the transparent film 701 on which the printing member is disposed. The adhesive member 750 may include, for example, optically clear adhesive ("OCA") film, or the like.

In the present exemplary embodiment, the cover film 700 may be attached to the first polarizing film 211 by the adhesive member 750. Although not illustrated in FIG. 10, another adhesive member may be further disposed on the printing member on the printing area 731.

According to exemplary embodiments, the cover film 700 may include the transparent film 701, the printing member, the adhesive member 750 and the first polarizing film 211. In this case, an additional polarizing film may not be disposed on the array substrate 210.

Figure 11:
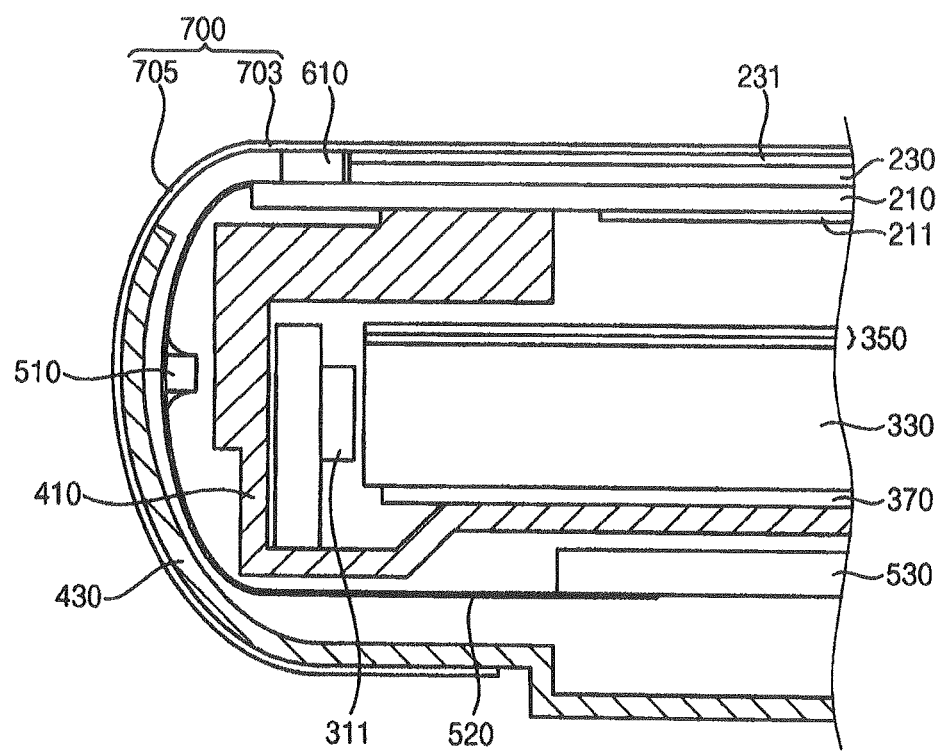
FIG. 11 is a cross-sectional view illustrating a liquid crystal display device according to an exemplary embodiment of the inventive concept.

FIG. 11 is a cross-sectional view illustrating a liquid crystal display device according to an exemplary embodiment of the inventive concept.

In reference to FIG. 11, the liquid crystal display device according to the present exemplary embodiment may be substantially the same as the liquid crystal display device illustrated in FIG. 2 except a cover film 700 and a bottom chassis 430. In FIG. 11, a data driving part 510, a circuit board 530 and a circuit film 520 are further illustrated. Hereinafter, the identical elements are briefly described.

The liquid crystal display device according to the present exemplary embodiment may include a liquid crystal display panel, a backlight assembly, a receiving container, a capacitive type touch function key 610 and a cover film 700. The liquid crystal display device may further include an image driving part.

The liquid crystal display panel may include an array substrate 210 and an opposing substrate 230. The opposing substrate 230 may face the array substrate 210. The liquid crystal display panel may further include a first polarizing film 211 disposed on the array substrate 210 and a second polarizing film 231 disposed on the opposing substrate 230. Although not illustrated in FIG. 11, a liquid crystal layer may be disposed between the array substrate 210 and the opposing substrate 230.

The array substrate 210 may include a plurality of gate lines, a plurality of data lines, a plurality of switching elements and a plurality of pixel electrodes. The data lines may extend in a first direction. The data lines may be arranged in a second direction crossing the first direction. The gate lines may extend in the second direction. The gate lines may be arranged in the first direction. The switching elements may be electrically connected to the gate lines and the data lines. The pixel electrodes may be electrically connected to the switching elements. The array substrate 210 may have a width greater than the opposing substrate 230 in a plan view. For example, a width of the array substrate 210 may be greater than a width of the opposing substrate 230 along a first direction.

The image driving part may be configured to apply electrical signals to the liquid crystal display panel. The image driving part may include a data driving part 510. The data driving part 510 may be disposed on a circuit film 520. The data driving part 510 may be electrically connected to a circuit board 530.

The backlight assembly may include a light source part, a light guiding plate 330, an optical sheet 350 and a reflection sheet 370.

The light source part may include a plurality of point light sources 311.

The light guiding plate 330 may overlap a display area of the liquid crystal display panel. The light guiding plate 330 may be configured to guide light incident from the light source part toward a direction perpendicular to the incident light.

The reflection sheet 370 may be disposed on a rear surface of the light guiding plate 330. The reflection sheet 370 may be configured to reflect the light from the point light sources 311 toward the light guiding plate 330.

The optical sheet 350 may be disposed on the upper surface of the light guiding plate 330. The optical sheet 350 may be configured to diffuse the light from the light guiding plate 330.

Although the backlight assembly has an edge-illumination type structure in FIG. 11, the backlight assembly of the liquid crystal display device according to exemplary embodiments of the inventive concept is not limited thereto. For example, the backlight assembly may have a direct-illumination type structure in which a light source is disposed under a display area of the liquid crystal display panel.

The receiving container 400 may include a mold frame 410 and a bottom chassis 430.

The mold frame 410 may receive the backlight assembly. The mold frame 410 may support the liquid crystal display panel. For example, the mold frame 410 may partially support a rear surface of the liquid crystal display panel.

The bottom chassis 430 may receive the mold frame 410, the liquid crystal display panel and the capacitive type touch function key 610. The bottom chassis 430 may include a side surface having a curvature and a bottom portion connected to the side surface. For example, the side surface of the bottom chassis 430 may include a curved surface.

The capacitive type touch function key 610 may be disposed adjacent to a side surface of one of the array substrate 210 and the opposing substrate 230. For example, the capacitive type touch function key 610 may be disposed adjacent to a side surface of the opposing substrate 230. The capacitive type touch function key 610 may be disposed on the array substrate 210. For example, the capacitive type touch function key 610 may be disposed on a portion of the array substrate 210 which does not overlap the opposing substrate 230.

In the present exemplary embodiment, the capacitive type touch function key 610 may have a thickness substantially equal to or less than a thickness of the opposing substrate 230. For example, the thickness of the capacitive type touch function key 610 may be substantially equal to a sum of thicknesses of the opposing substrate 230 and the second polarizing film 231.

The capacitive type touch function key 610 may be disposed on the array substrate 210. The capacitive type touch function key 610 may include a function key configured to adjust brightness, chrominance, contrast of an image displayed on the liquid crystal display panel. The capacitive type touch function key may be operable as a capacitive type.

The cover film 700 may be disposed on the opposing substrate 230 on which the second polarizing film 231 is disposed. The cover film 700 may overlap the liquid crystal display panel and the capacitive type touch function key 610. The cover film 700 may include a flat portion 703 and a curved portion 705. The flat portion 703 of the cover film 700 may be a substantially flat surface on the second polarizing film 231 and the capacitive type touch function key 610. The curved portion 705 of the cover film 700 may overlap the curved side surface of the bottom chassis 430. The flat portion 703 and the curved portion 705 of the cover film 700 may be integrally formed. The curved portion 705 of the cover film 700 may surround a portion of the bottom chassis 430 in a cross-sectional view. The curvature of the curved portion 705 of the cover film 700 may be substantially the same as the curvature of the curved side surface of the bottom chassis 430.

As mentioned above, according to one or more exemplary embodiment of the liquid crystal display device, the liquid crystal display device may include a capacitive type touch function key to adjust brightness, chrominance, contrast, or the like of the liquid crystal display panel, and a cover film may cover both the capacitive type touch function key and the liquid crystal display panel, thereby implementing a flat display screen even in a bezel area without an additional top chassis and improving viewing convenience of a user.

Also, the cover film may include a printing area to display a position of the capacitive type touch function key, thereby easily operating the function key to adjust a display status of the liquid crystal display panel.

Furthermore, the printing area of the color film may include a color printing area, or the cover film may include a curved portion to surround a portion of a bottom chassis, thereby improving an applicability of a design of the liquid crystal display device.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the present inventive concept. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A liquid crystal display device, comprising:
a backlight assembly configured to generate light;
a liquid crystal display panel disposed on the backlight assembly, the liquid crystal display panel comprising an array substrate having a surface and an opposing substrate having a surface that faces the surface of the array substrate;
a capacitive type touch function key disposed on a side surface of one of the array substrate and the opposing substrate, the side surface of said one of the array substrate and the opposing substrate being perpendicular to the surface of the array substrate and to the surface of the opposing substrate;

a cover film overlapping the liquid crystal display panel and the capacitive type touch function key; and a receiving container receiving the backlight assembly, the liquid crystal display panel and the capacitive type touch function key.

2. The liquid crystal display device of claim 1, wherein a width of the array substrate is greater than a width of the opposing substrate along a first direction.

3. The liquid crystal display device of claim 1, wherein the capacitive type touch function key is configured to adjust one of brightness, chrominance and contrast of an image displayed on the liquid crystal display panel.

4. The liquid crystal display device of claim 1, wherein the cover film comprises a flat surface.

5. The liquid crystal display device of claim 1, wherein the cover film comprises a light transmitting area, through which light from the liquid crystal display panel transmits, and a printing area disposed next to the light transmitting area, the liquid crystal display device including a printing member disposed on the printing area.

6. The liquid crystal display device of claim 5, wherein the printing area overlaps the capacitive type touch function key.

7. The liquid crystal display device of claim 6, wherein a width of the printing area is greater than a width of the capacitive type touch function key.

8. The liquid crystal display device of claim 5, wherein the printing area comprises:

a first printing area having a first color; and a second printing area having a second color different from the first color.

9. The liquid crystal display device of claim 8, wherein the capacitive type touch function key overlaps the first printing area.

10. The liquid crystal display device of claim 1, further comprising:

a first polarizing film disposed on the array substrate; and a second polarizing film disposed on the opposing substrate.

11. The liquid crystal display device of claim 10, further comprising an adhesive member to attach the first polarizing film with the cover film.

12. The liquid crystal display device of claim 10, wherein a thickness of the capacitive type touch function key is equal to or less than a sum of a thickness of the opposing substrate and a thickness of the second polarizing film.

13. The liquid crystal display device of claim 1, further comprising a spacer overlapping a portion of the array substrate, wherein the capacitive type touch function key is attached to the spacer.

14. The liquid crystal display device of claim 13, wherein a thickness of the spacer is substantially equal to a sum of a thickness of the opposing substrate and a thickness of the second polarizing film.

15. The liquid crystal display device of claim 1, wherein the array substrate is disposed between the backlight assembly and the opposing substrate.

16. The liquid crystal display device of claim 1, wherein the capacitive type touch function key is disposed on the array substrate.

17. The liquid crystal display device of claim 1, wherein the opposing substrate is disposed between the backlight assembly and the array substrate.

18. The liquid crystal display device of claim 1, wherein the receiving container comprises:

a mold frame receiving the backlight assembly and partially supporting a rear surface of the liquid crystal display panel; and a bottom chassis receiving the liquid crystal display panel, the capacitive type touch function key and the mold frame.

19. The liquid crystal display device of claim 18, wherein the cover film comprises:

a flat surface portion overlapping the liquid crystal display panel and the capacitive type touch function key; and a curved surface portion connected to the flat surface portion and surrounding a portion of the bottom chassis.

* * * * *